United States Patent
Detterbeck

(10) Patent No.: US 8,894,877 B2
(45) Date of Patent: Nov. 25, 2014

(54) METHOD, APPARATUS AND COMPOSITION FOR WET ETCHING

(75) Inventor: Stefan Detterbeck, Villach (AT)

(73) Assignee: Lam Research AG, Villach (AT)

( * ) Notice: Subject to any disclaimer, the term of this patent is extended or adjusted under 35 U.S.C. 154(b) by 386 days.

(21) Appl. No.: 13/276,925

(22) Filed: Oct. 19, 2011

(65) Prior Publication Data

US 2013/0102158 A1 Apr. 25, 2013

(51) Int. Cl.
| | |
|---|---|
| C09K 13/00 | (2006.01) |
| C09K 13/04 | (2006.01) |
| C09K 13/08 | (2006.01) |
| C03C 15/00 | (2006.01) |
| C25F 3/00 | (2006.01) |
| H01L 21/3213 | (2006.01) |
| H01L 27/102 | (2006.01) |
| H01L 27/105 | (2006.01) |

(52) U.S. Cl.
CPC ............. C09K 13/08 (2013.01); H01L 27/1021 (2013.01); H01L 27/1052 (2013.01); H01L 21/32134 (2013.01)
USPC ......... 252/79.1; 216/108; 216/109; 252/79.2; 252/79.3; 438/753

(58) Field of Classification Search
USPC ............................ 216/97, 108, 109; 438/753; 252/79.1–79.3
See application file for complete search history.

(56) References Cited

U.S. PATENT DOCUMENTS

| | | | |
|---|---|---|---|
| 4,157,269 A | 6/1979 | Ning et al. | |
| 4,903,717 A | 2/1990 | Sumnitsch | |
| 5,518,966 A | 5/1996 | Woo | |
| 6,123,865 A | 9/2000 | Lin et al. | |
| 6,290,863 B1 | 9/2001 | Morgan et al. | |
| 6,536,454 B2 | 3/2003 | Lindner | |
| 6,800,326 B1 * | 10/2004 | Uchiyama | 427/309 |
| 7,166,539 B2 | 1/2007 | Fucsko et al. | |
| 7,837,803 B2 | 11/2010 | Hohenwarter | |
| 2003/0119332 A1 | 6/2003 | Kuebelbeck et al. | |
| 2003/0230548 A1 | 12/2003 | Sievert et al. | |
| 2010/0216315 A1 | 8/2010 | Yaguchi et al. | |
| 2011/0101298 A1 | 5/2011 | Tang et al. | |

FOREIGN PATENT DOCUMENTS

| | | |
|---|---|---|
| WO | 2004/084278 | 9/2004 |
| WO | 2011/053731 | 5/2011 |

OTHER PUBLICATIONS

S. Marschmeyer and B. Heinemann, "Dry Chemical Opening of Emitter Windows of High Speed pnp SiGe:C HBTs in a Complementary BiCMOS Technology", IHP, Frankfurt/Oder, Germany, pp. 4.

Marcus Lippold, Sebastian Patzig-Klein, and Edwin Krokefe, Abstract of "HF—HNO3—H2SO4/H2O Mixtures for Etching Multicrystalline Silicon Surfaces: Formation of NO2 +,Reaction Rates and Surface Morphologies", Z. Naturforsch. 2011, 66b, 155; received Oct. 19, 2010.

(Continued)

*Primary Examiner* — Allan Olsen
*Assistant Examiner* — Margaret D Klunk
(74) *Attorney, Agent, or Firm* — Young & Thompson

(57) ABSTRACT

A liquid composition for wet etching has improved selectivity for polysilicon over silicon dioxide, even when the polysilicon is heavily doped and/or the silicon dioxide is a low temperature oxide. The composition comprises 0.05-0.4 percent by weight hydrofluoric acid, 15-40 percent by weight nitric acid, 55-85 percent by weight sulfuric acid and 2-20 percent by weight water. A method and apparatus for wet etching using the composition are also disclosed.

12 Claims, 4 Drawing Sheets

(56) References Cited

OTHER PUBLICATIONS

Kirt R. Williams and Richard S. Muller, "Etch Rates for Micromachining Processing", Journal of Microelectromechanical Systems, vol. 5, No. 4, Dec. 1996.

Kirt R. Williams, Kishan Gupta, and Matthew Wasilik, "Etch Rates for Micromachining Processing—Part II", Journal of Microelectromechanical Systems, vol. 12, No. 6, Dec. 2003.

International Search Report, dated Feb. 22, 2013, from corresponding PCT application.

* cited by examiner

METHOD, APPARATUS AND COMPOSITION FOR WET ETCHING

BACKGROUND OF THE INVENTION

1. Field of the Invention

The invention relates to a method, apparatus and composition for wet etching, and more particularly, a method, apparatus and composition for wet etching layers formed on a semiconductor substrate

2. Description of Related Art

Various semiconductor fabrication techniques involve wet etching of layers grown on a semiconductor substrate. Selective etching is utilized to remove layers of one material without significantly degrading layers formed of another material.

For example, in component fabrication for micro-electro-mechanical systems (MEMS), it is conventional to form structural layers of polysilicon alternating with sacrificial layers of $SiO_2$, whereafter the $SiO_2$ layers are removed by wet etching with a composition that is selective for $SiO_2$ and selective against polysilicon.

Wet etching compositions that are selective for polysilicon and selective against $SiO_2$ are also known. Whereas HF etches $SiO_2$, mixtures of $HNO_3$ and HF will selectively etch polysilicon relative to $SiO_2$, provided that the ratio of $HNO_3$ to HF is sufficiently high.

However recent industry trends favor layers of silicon dioxide that are deposited at low temperature, and layers of polysilicon that are heavily doped. The usage of these modified materials, especially in combination, degrades the etch selectivity of conventional wet etchants and thus makes it very difficult to remove polycrystalline silicon selectively relative to silicon dioxide.

In particular, silicon oxide deposited at low temperature can show etch rates with mixtures of hydrofluoric acid and nitric acid up to four times greater than the etch rate of silicon oxides that are deposited at higher temperatures. Moreover, highly doped polycrystalline silicon can show significantly lower etch rates with the above shown mixtures. When these materials are used in combination the etch selectivity for polysilicon to silicon dioxide can drop from levels as high as 80 down to levels of as low as 2.

SUMMARY OF THE INVENTION

The present invention in one aspect relates to a liquid composition for wet etching, comprising 0.05-0.4 percent by weight hydrofluoric acid, 15-40 percent by weight nitric acid, 55-85 percent by weight sulfuric acid and 2-20 percent by weight water.

In preferred embodiments of the liquid composition for wet etching according to the present invention, the hydrofluoric acid is present in an amount from 0.1 to 0.3 percent by weight.

In preferred embodiments of the liquid composition for wet etching according to the present invention, the nitric acid is present in an amount from 18 to 30 percent by weight.

In preferred embodiments of the liquid composition for wet etching according to the present invention, the sulfuric acid is present in an amount from 60 to 80 percent by weight.

In preferred embodiments of the liquid composition for wet etching according to the present invention, the water is present in an amount of less than 17 percent by weight.

The present invention in another aspect relates to a method of wet etching layers formed on a substrate, comprising applying to a substrate having formed thereon at least one layer of silicon dioxide and at least one layer of polysilicon, a liquid wet etching composition comprising 0.05-0.4 percent by weight hydrofluoric acid, 15-40 percent by weight nitric acid, 55-85 percent by weight sulfuric acid and 2-20 percent by weight water, to selectively etch the at least one layer of polysilicon relative to the at least one layer of silicon dioxide.

In preferred embodiments of the method for wet etching according to the present invention, the substrate is a semiconductor wafer, and the method further comprises rotating the semiconductor wafer on a spin chuck while the wet etching composition is applied to the semiconductor wafer.

In preferred embodiments of the method for wet etching according to the present invention, the liquid wet etching composition is dispensed from above the semiconductor wafer onto an upwardly facing surface of the semiconductor wafer.

In preferred embodiments of the method for wet etching according to the present invention, the liquid wet etching composition is passed through a heat exchanger so as to maintain a temperature of the liquid wet etching composition within +/−1K of a target temperature, prior to applying the liquid etchant composition to the substrate.

In preferred embodiments of the method for wet etching according to the present invention, the at least one layer of silicon dioxide overlies the at least one layer of polysilicon, and the liquid etchant composition is applied to an opening that traverses the at least one layer of silicon dioxide and the at least one layer of polysilicon, so as to form an undercut in the at least one layer of polysilicon.

In preferred embodiments of the method for wet etching according to the present invention, the at least one layer of silicon dioxide and the at least one layer of polysilicon form part of a pnp emitter window in a heterojunction bipolar transistor.

In preferred embodiments of the method for wet etching according to the present invention, the liquid wet etching composition comprises from 0.1 to 0.3 percent by weight hydrofluoric acid, from 18 to 30 percent by weight nitric acid, from 60 to 80 percent by weight sulfuric acid, and from 2% to less than 17% water.

The present invention in yet another aspect relates to an apparatus for wet etching, comprising a spin chuck for holding a substrate in a predetermined orientation and for rotating the substrate about an axis of rotation; a supply of a liquid wet etching composition comprising 0.05-0.4 percent by weight hydrofluoric acid, 15-40 percent by weight nitric acid, 55-85 percent by weight sulfuric acid and 2-20 percent by weight water; and a dispenser positioned above the spin chuck to dispense the liquid wet etching composition onto an upwardly facing surface of the substrate, to selectively etch at least one layer of polysilicon formed on the substrate relative to at least one layer of silicon dioxide formed on the substrate.

In preferred embodiments of the apparatus for wet etching according to the present invention, at least one of the supply of liquid wet etching composition and the dispenser comprises a heat exchanger for maintaining the liquid wet etching composition within +/−1K of a target temperature.

In preferred embodiments of the apparatus for wet etching according to the present invention, the apparatus is a process module for single wafer wet processing of semiconductor wafers.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION

The present inventor has discovered that improved selectivity for wet etching polysilicon relative to silicon dioxide can be achieved, even for combination of low temperature oxides and heavily doped polysilicons, by a composition in which hydrofluoric acid and nitric acid are combined with a preponderance of sulphuric acid. In particular, the compositions comprise 0.05-0.4 percent by weight hydrofluoric acid, 15-40 percent by weight nitric acid, 55-85 percent by weight sulfuric acid and 2-20 percent by weight water.

The weight ratio of nitric acid to hydrofluoric acid is preferably from 50 to 800, more preferably from 60 to 300, and most preferably from 70 to 150.

In conventional wet etching solutions for polysilicon, it is considered that the nitric acid oxidizes the polysilicon, with the oxide then being dissolved by the hydrofluoric acid. Hydrofluoric acid also is an etchant of silicon dioxide, but when the ratio of $HNO_3$ to HF is high, then the etching selectivity is acceptably high.

However, the conventional etchants no longer perform with satisfactory selectivity, as discussed above, when the silicon oxide is a low temperature oxide (LTO), such as for example those formed from deposition of silane gas at temperatures of about 300-500° C.; and/or when the polysilicon is heavily doped.

Figure 1:
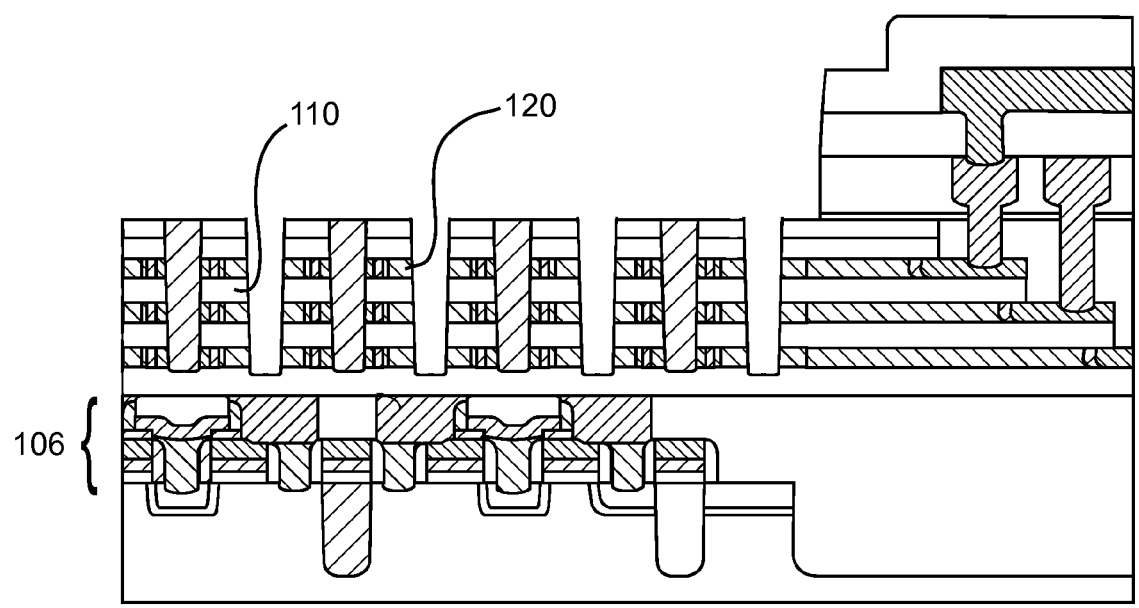
FIG. 1 is a schematic perspective view of a semiconductor structure to which the method according to the invention may be applied.

The wet etching compositions according to the present invention overcome these shortcomings of the prior art. As shown in FIG. 1, a structure to which the composition and method according to the invention may be applied comprises an alternating series of low temperature oxide layers 110 and heavily doped polysilicon layers 120 formed on an underlying substrate, e.g., a semiconductor substrate such as silicon or silicon-on-insulator (SOI) or glass.

These polysilicon layers 120 may include polysilicon that is doped with an n-type dopant, such as phosphorous or arsenic, (i.e., p-type polysilicon) or a p-type dopant, such as boron or aluminum (i.e., n-type polysilicon). For example, a PLAD process may be used to implant phosphorous or arsenic such that the polysilicon layers 120 comprise n-type polysilicon.

Layers 110 and 120 may have a thickness for example of from about 20 nm to about 50 nm. In some embodiments, the layers 110 and 120 may be deposited over one another using a conventional chemical vapor deposition (CVD) process.

Figure 2:
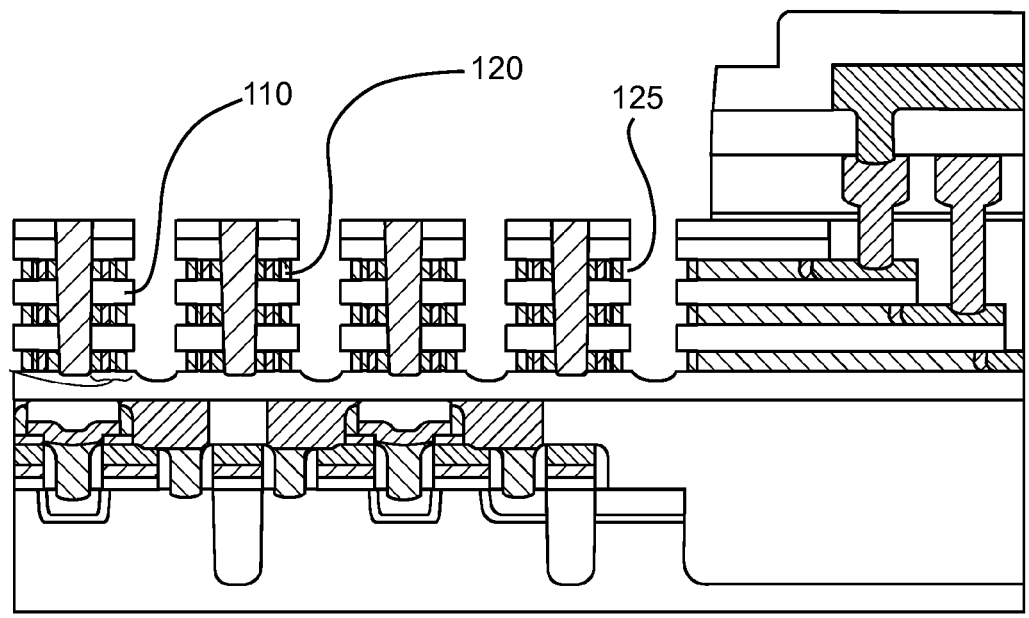
FIG. 2 is a schematic perspective view of a semiconductor structure to which the method according to the invention has been applied.

The structure depicted in FIGS. 1 and 2 corresponds to that shown in FIGS. 31B and 34, respectively, of U.S. Patent Publication No. 2011/0101298, although the materials of the layers 110 and 120 is not necessarily the same. In that structure, the alternating layers form superposed diodes comprised within memory strings overlying a MOSFET array 106.

The trench formed into that series of layers is formed by a dry etching technique, anisotropically, such that the trench is about 0.25 μm wide and 1 μm high, i.e., with an aspect ratio of about 4.

The wet etching composition according to the invention is then applied to the FIG. 1 structure. Etching of the polysilicon occurs isotropically by wet etching, but the selectivity of the compositions according to the invention causes the polysilicon layers 120 to be etched preferentially to etching of silicon dioxide layers 110, so as to form undercut regions 125.

Figure 4:
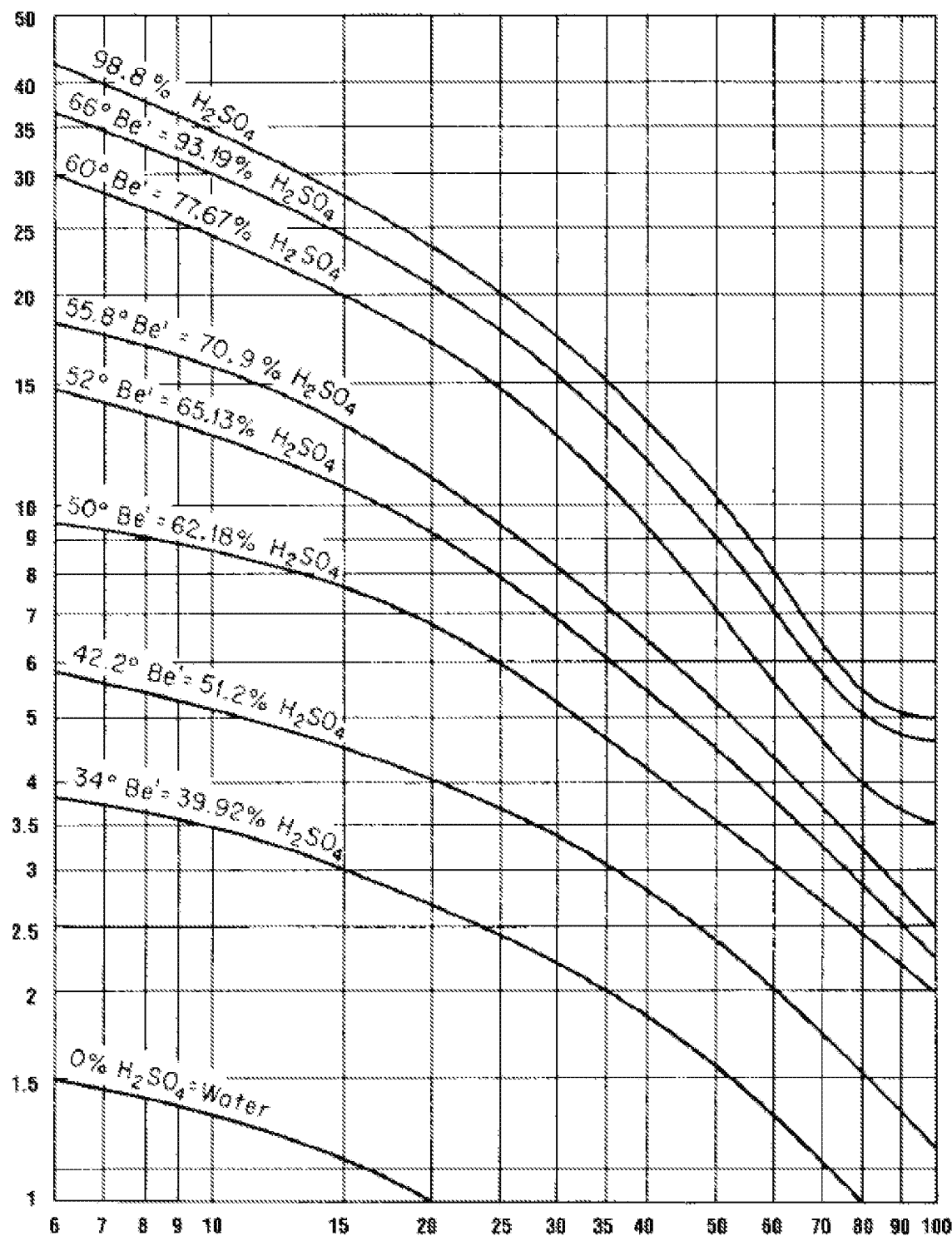
FIG. 4 shows the relationship of viscosity to temperature for a series of concentrated aqueous solutions of sulphuric acid.

Without wishing to be held to any particular theory, it is believed that the high content of sulfuric acid and the low content of water, serve to retard the dissociation of the nitric acid so that it may act more effectively in oxidizing the polysilicon. Additionally, at the high concentrations of sulfuric acid employed according to the invention, the liquid composition will be relatively viscous, as indicated generally by the data shown in FIG. 4 as to concentrated aqueous solutions of sulfuric acid. That high viscosity is believed to retain the HF in close proximity to the nitric acid molecules, so as to act preferentially on the oxidized polysilicon rather than upon the preexisting silicon dioxide layers 110.

Figure 3:
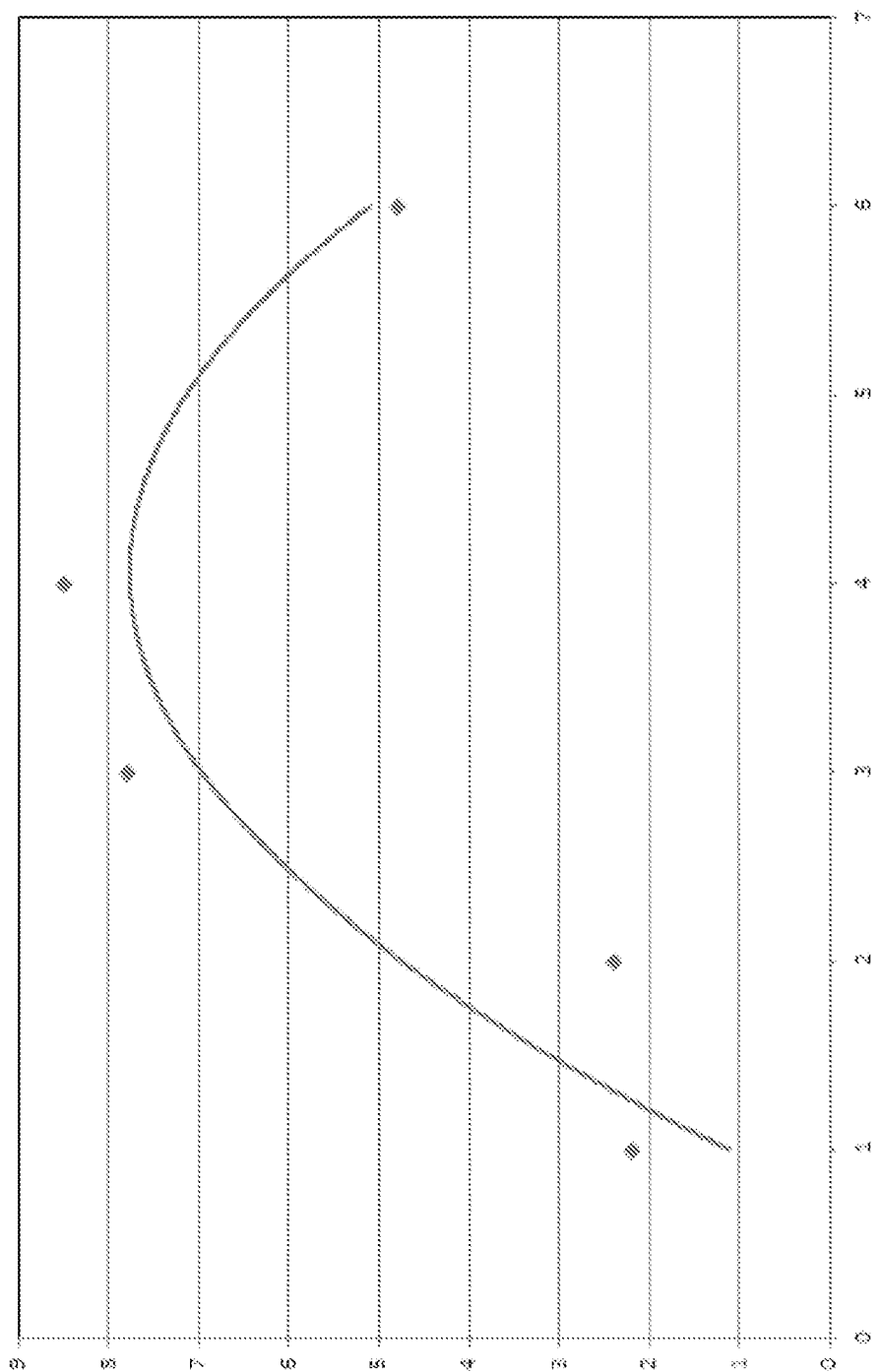
FIG. 3 is a graph plotting etching selectivity for each of a series of etching compositions.

In FIG. 3, the etching selectivity of six different wet etching compositions is plotted. The vertical axis represents the degree of etching selectivity of polysilicon relative to silicon dioxide, whereas each of the six sample compositions is distributed along the horizontal axis. The liquid etchants plotted in FIG. 3 were of the following compositions:

| Mixture | % weight | | | |
| --- | --- | --- | --- | --- |
|  | HF | HNO3 | H2SO4 | H2O |
| 1 | 0.8% | 67.9% | 0.0% | 32.7% |
| 2 | 0.5% | 41.2% | 39.4% | 21.5% |
| 3 | 0.4% | 29.6% | 56.6% | 16.6% |
| 4 | 0.3% | 23.1% | 66.2% | 13.9% |
| 5 | 0.2% | 18.9% | 72.4% | 12.1% |
| 6 | 0.2% | 13.9% | 79.8% | 10.0% |

As can be seen from FIG. 3 and the above table, a conventional $HF/HNO_3/H_2O$ etchant with no sulfuric acid content resulted in an etch selectivity of only about two when used on low temperature oxides and heavily doped polysilicon as depicted in FIGS. 1 and 2.

However, the mixture 2 shows that a sulfuric acid content of 39.4 weight percent did not significantly improve the etching selectivity, despite that the water content was reduced relative to that of mixture 2, and the ratio of nitric to hydrofluoric acid was about the same. On the contrary, a dramatic and unexpected increase in the etching selectivity was found for the mixtures 3 and 4, in which the sulfuric acid content was increased to 56.6 and 66.2%, respectively, with the ratio of nitric to hydrofluoric acid being somewhat lower but still generally similar to that of mixtures 1 and 2.

Mixture 6 showed a steep dropoff in etching selectivity relative to mixtures 3 and 4, although the performance was still superior to the conventional composition (mixture 1). Here, the content of nitric acid was considered too low to sufficiently oxidize the polysilicon fast enough to attain a higher selectivity. Mixture 5 was not tested but would apparently fall on the curve generated by the test results of the other five mixtures.

Figure 5:
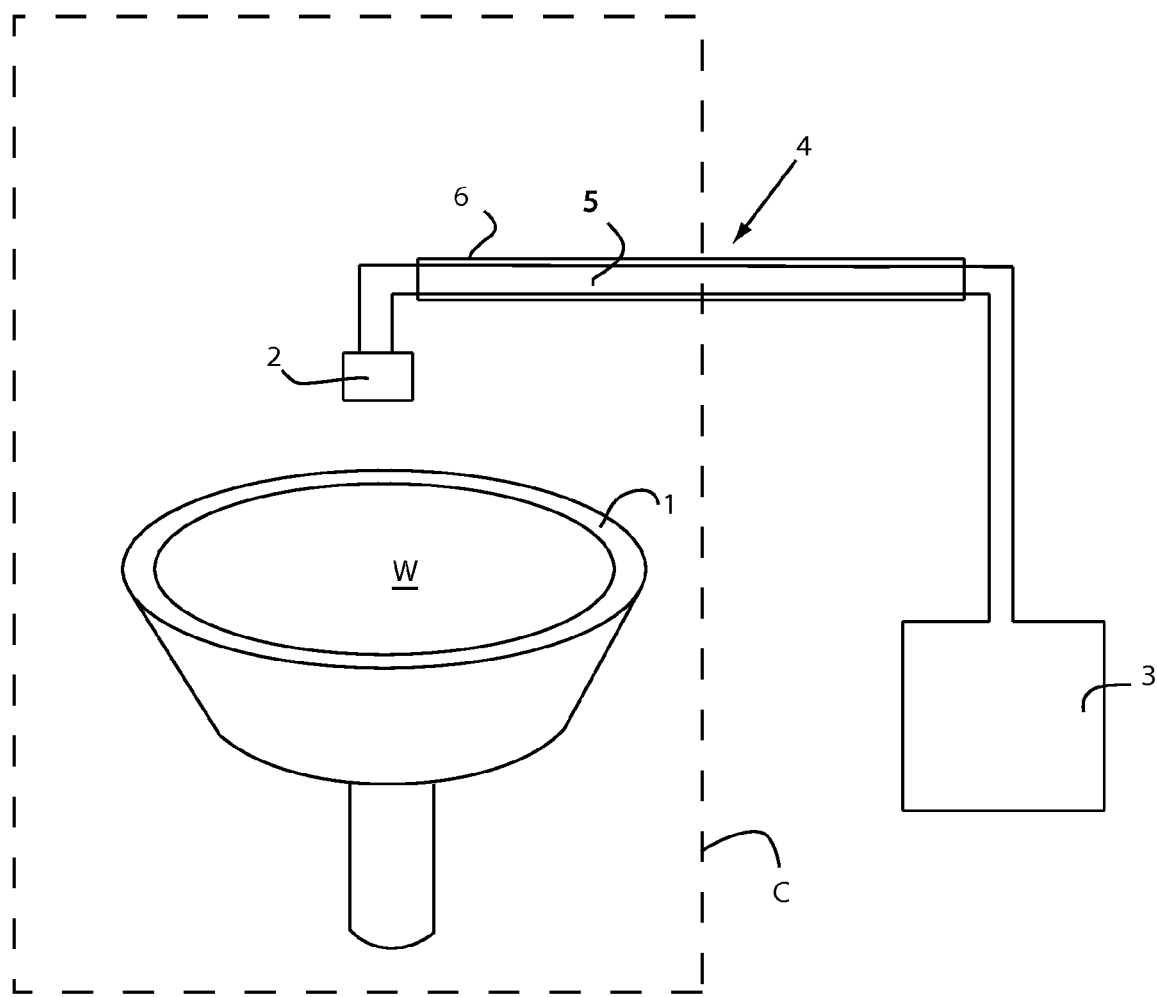
FIG. 5 is a schematic diagram of an embodiment of an apparatus according to the present invention.

FIG. 5 depicts an apparatus suitable for carrying out the method according to the invention. In particular, reference numeral 1 denotes a spin chuck in a chamber C, which is preferably a process module for single wafer wet processing of semiconductor wafers. Chamber C is preferably a closed module so as to confine the chemicals used. A 300 mm semiconductor wafer W is positioned on the spin chuck 1 and gripped by gripping pins (not shown).

Spin chuck 1 holds a wafer W thereon in a predetermined orientation, which is preferably such that the major surfaces of the wafer are disposed horizontally or within ±20° of horizontal. Spin chuck 1 may for example be a chuck that operates according to the Bernoulli principle, as described for example in U.S. Pat. No. 4,903,717.

A wet etching is carried out by supplying the liquid wet etching composition according to the invention from a reservoir 3 containing the same, to a dispenser 4. Dispenser 4 includes a preferably movable dispensing nozzle 2 positioned above an upwardly facing surface of wafer W. Dispenser 4 further comprises a conduit 5 extending between the reservoir 3 and the nozzle 2, which conduit 5 is surrounded by an in-line heat exchanger 6. The heat exchanger 6 is adapted to maintain a temperature of the etchant composition within +/−1K of a target temperature (which could be ambient temperature), so as to provide greater viscosity control as well to adjust the etching time to an optimum range. In addition to or instead of in-line heat exchanger 6, reservoir 3 may be equipped with a heat exchanger for the liquid etchant composition.

When dispensing the etchant composition the dispensing nozzle 2 preferably can be moved across the wafer at a selected speed from the center towards the edge and back to center. This movement can be repeated as long as the respective liquid is dispensed. The spin speed during dispensing the etching liquids is preferably set to be in a range of 300 rpm to 2000 rpm.

Process chamber C may be a multi-level process chamber as described in commonly-owned U.S. Pat. No. 7,837,803 (corresponding to WO 2004/084278). The spin chuck can be positioned at the selected level by moving the chuck axially relative to the stationary surrounding chamber, or by moving the surrounding chamber axially relative to the axially-stationary chuck, as described in connection with FIG. 4 of U.S. Pat. No. 6,536,454.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A liquid composition for wet etching, comprising:
   0.05-0.4 percent by weight hydrofluoric acid;
   15-40 percent by weight nitric acid;
   55-85 percent by weight sulfuric acid; and
   2-20 percent by weight water.

2. The composition according to claim 1, wherein said hydrofluoric acid is present in an amount from 0.1 to 0.3 percent by weight.

3. The composition according to claim 1, wherein said nitric acid is present in an amount from 18 to 30 percent by weight.

4. The composition according to claim 1, wherein said sulfuric acid is present in an amount from 60 to 80 percent by weight.

5. The composition according to claim 1, wherein said water is present in an amount of less than 17 percent by weight.

6. A method of wet etching layers formed on a substrate, comprising applying to a substrate having formed thereon at least one layer of silicon dioxide and at least one layer of polysilicon, a liquid wet etching composition comprising 0.05-0.4 percent by weight hydrofluoric acid, 15-40 percent by weight nitric acid, 55-85 percent by weight sulfuric acid and 2-20 percent by weight water, to selectively etch said at least one layer of polysilicon relative to said at least one layer of silicon dioxide.

7. The method according to claim 6, wherein the substrate is a semiconductor wafer, and wherein said method further comprises rotating the semiconductor wafer on a spin chuck while the wet etching composition is applied to the semiconductor wafer.

8. The method according to claim 7, wherein the liquid wet etching composition is dispensed from above the semiconductor wafer onto an upwardly facing surface of the semiconductor wafer.

9. The method according to claim 6, further comprising performing heat exchange on the liquid wet etching composition to maintain a temperature of the liquid wet etching composition within +/−1K of a target temperature, prior to applying the liquid etchant composition to the substrate.

10. The method according to claim 6, wherein the at least one layer of silicon dioxide overlies the at least one layer of polysilicon, and wherein the liquid etchant composition is applied to an opening that traverses the at least one layer of silicon dioxide and the at least one layer of polysilicon, so as to form an undercut in the at least one layer of polysilicon.

11. The method according to claim 10, wherein the at least one layer of silicon dioxide and the at least one layer of polysilicon form part of a pnp emitter window in a heterojunction bipolar transistor.

12. The method according to claim 6, wherein the liquid wet etching composition comprises from 0.1 to 0.3 percent by weight hydrofluoric acid, from 18 to 30 percent by weight nitric acid, from 60 to 80 percent by weight sulfuric acid, and from 2% to less than 17% water.

* * * * *